(12) United States Patent
Kim et al.

(10) Patent No.: US 12,069,806 B2
(45) Date of Patent: Aug. 20, 2024

(54) DISPLAY DEVICE

(71) Applicant: Samsung Display Co., LTD., Yongin-si (KR)

(72) Inventors: Min-Hong Kim, Hwaseong-si (KR); Hyun-Wook Cho, Yongin-si (KR); Taejoon Kim, Seongnam-si (KR); Jungmok Park, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 347 days.

(21) Appl. No.: 17/681,842

(22) Filed: Feb. 28, 2022

(65) Prior Publication Data
US 2022/0361337 A1 Nov. 10, 2022

(30) Foreign Application Priority Data
May 10, 2021 (KR) .................. 10-2021-0060145

(51) Int. Cl.
*H05K 1/18* (2006.01)
*H05K 1/14* (2006.01)
*H02J 50/00* (2016.01)
*H02J 50/10* (2016.01)

(52) U.S. Cl.
CPC .............. *H05K 1/18* (2013.01); *H05K 1/147* (2013.01); *H02J 50/005* (2020.01); *H02J 50/10* (2016.02); *H05K 2201/1003* (2013.01); *H05K 2201/10128* (2013.01)

(58) Field of Classification Search
CPC .. H05K 1/18; H05K 1/147; H05K 2201/1003; H05K 2201/10128; H02J 50/10; H02J 50/005

USPC ....................................................... 361/679.01
See application file for complete search history.

(56) References Cited

U.S. PATENT DOCUMENTS

| | | | |
|---|---|---|---|
| 7,948,763 B2 | 5/2011 | Chuang | |
| 8,760,871 B2 | 6/2014 | Kim | |
| 2018/0130974 A1* | 5/2018 | Koo | ..................... H10K 77/111 |
| 2020/0136243 A1* | 4/2020 | Shin | ..................... H04M 1/026 |
| 2021/0185809 A1* | 6/2021 | Park | ..................... H05K 1/0225 |

FOREIGN PATENT DOCUMENTS

| KR | 10-0686847 | 2/2007 |
|---|---|---|
| KR | 10-2007-0108587 | 11/2007 |
| KR | 10-1056261 | 8/2011 |
| KR | 10-2016-0090602 | 8/2016 |

\* cited by examiner

*Primary Examiner* — Binh B Tran
(74) *Attorney, Agent, or Firm* — CANTOR COLBURN LLP

(57) ABSTRACT

A display device includes a display panel including a first surface and a second surface opposite to the first surface, the second surface having a first area and a second area surrounding the first area, a conductive sheet disposed on the second surface of the display panel and including a first conductive line disposed in the first area and extending in a first direction and a conductive layer disposed in the second area, a first circuit board bending from the first surface to the second surface to be connected to a first end of the first conductive line, and a second circuit board spaced apart from the first circuit board in the first direction, the second circuit board bending from the first surface to the second surface to be connected to a second end opposite to the first end of the first conductive line.

20 Claims, 14 Drawing Sheets

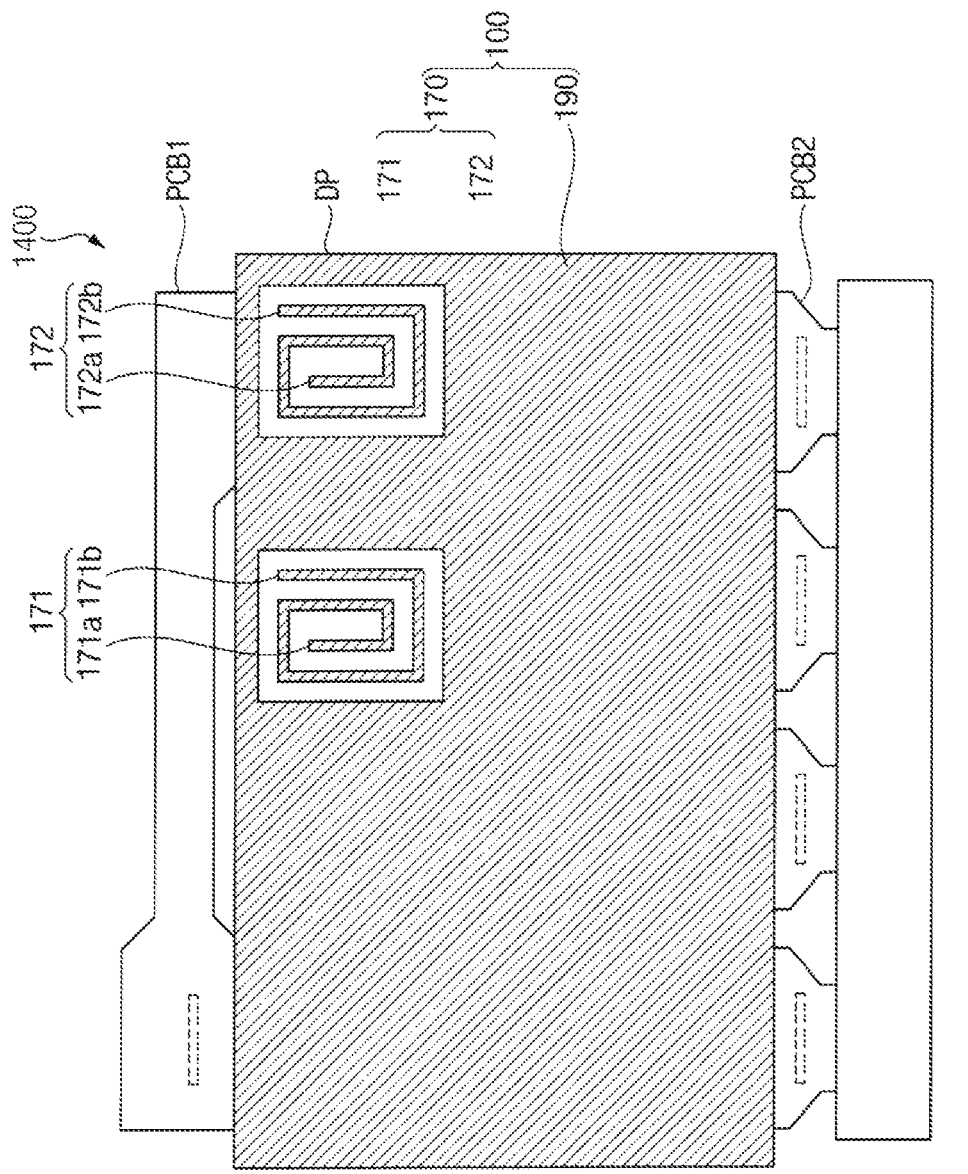
FIG. 14
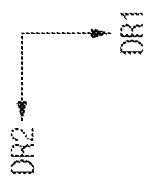

DISPLAY DEVICE

CROSS-REFERENCE TO RELATED APPLICATION

This application claims priority to and the benefit of Korean Patent Application No. 10-2021-0060145, filed on May 10, 2021, which is hereby incorporated by reference for all purposes as if fully set forth herein.

BACKGROUND

Field

Embodiments of the invention relate generally to a display device and, more specifically, to a display device that provides visual information.

Discussion of the Background

A cathode ray tube (CRT) television, which is one of display devices, has been widely used due to many advantages in terms of performance and price. The CRT television has disadvantages in terms of miniaturization or portability. As technology improves, display devices having smaller sizes, lighter weight, and superior performance have been produced. For example, a plasma display device, a liquid crystal display device, an organic light emitting display device, and a quantum dot display device having advantages such as miniaturization, light weight, and low power consumption have been drawn attention.

In order to have superior performance in the display device, the number of components included in the display device has increased. As the number of the components increases, the cost of the display device has increased. Thus, it is difficult to achieve lighter weight of the display device. Accordingly, there is a need for a method for improving a usability of components included in the display device.

The above information disclosed in this Background section is only for understanding of the background of the inventive concepts, and, therefore, it may contain information that does not constitute prior art.

SUMMARY

Display devices constructed according to the principles of the invention are capable of reducing or minimizing the cost, the thickness, and the weight of the display devices by providing a conductive sheet on a rear surface of a display panel of the display devices to reduce or minimize the required area of a circuit board of the display devices.

Display devices constructed according to the principles of the invention are capable of reducing or minimizing the cost, the thickness, and the weight of the display devices by providing a conductive sheet including an induction coil wire such that a separate charging socket for charging a charging target device is not required.

Display devices constructed according to the principles of the invention are capable of providing a conductive sheet having improved usability. For example, the conductive sheet included in the display devices may be used as a ground, may be used to dissipate heat, and may be used to evenly distribute temperature of the display panel DP, and may also be used to connect the circuit boards and may also be used to generate a charging current. In other words, utilization of the conductive sheet may be improved.

Additional features of the inventive concepts will be set forth in the description which follows, and in part will be apparent from the description, or may be learned by practice of the inventive concepts.

According to an aspect of the invention, a display device includes a display panel including a first surface and a second surface opposite to the first surface, the second surface having a first area and a second area surrounding the first area, a conductive sheet disposed under the display panel and including a first conductive line disposed in the first area and extending in a first direction and a conductive layer disposed in the second area, a first circuit board bending from the first surface to the second surface to be connected to a first end of the first conductive line, and a second circuit board spaced apart from the first circuit board in the first direction, the second circuit board bending from the first surface to the second surface to be connected to a second end opposite to the first end of the first conductive line under the conductive sheet.

The first conductive line may be spaced apart from the conductive layer.

A thickness of the first conductive line may be same as a thickness of the conductive layer.

The first conductive line and the conductive layer may include a same material, and wherein: the first surface of the display panel may be a front surface for displaying an image, and the second surface of the display panel may be a rear surface.

The first conductive line and the conductive layer may include copper.

The first conductive line may include a signal line and a power line having a width greater than a width of the signal line.

The display device may further include an insulating layer disposed between the display panel and the conductive sheet.

The first conductive line may include a plurality of connection lines spaced apart from each other in a second direction intersecting the first direction. The insulating layer in the first area may be exposed through an opening between the plurality of connection lines.

The conductive layer in the second area may cover the insulating layer.

The conductive sheet may further include a second conductive line disposed in the second area, extending in a second direction intersecting the first direction, and spaced apart from the conductive layer. The display device may further include a third circuit board spaced apart from the first circuit board in the second direction and connected to a first end of the second conductive line. The first circuit board may be connected to a second end opposite to the first end of the second conductive line.

According to another aspect of the invention, a display device includes a display panel including a first surface and a second surface opposite to the first surface, the second surface having a first area, a second area adjacent to the first area in a first direction, a third area adjacent to the first and second areas in a second direction intersecting the first direction, and a fourth area surrounding the first to third areas, a conductive sheet disposed on the second surface of the display panel and including a first conductive line extending from the first area to the third area and having a first end disposed in the first area and a second end opposite to the first end of the first conductive line disposed in the third area, a second conductive line extending from the second area to the third area and having a first end disposed in the second area and a second end opposite to the first end of the second conductive line disposed in the third area, and conductive layer disposed in the fourth area, a first circuit board bending from the first surface to the second surface to be connected to the first end of the first conductive line, and a second circuit board spaced apart from the first circuit board in the first direction, the second circuit board bending from the first surface to the second surface to be connected to the first end of the second conductive line, and an external device connected to the second end of the first conductive line and the second end of the second conductive line.

The first end of the first conductive line may extend in the first direction, the second end of the first conductive line may extend in the second direction. The first end of the second conductive line may extend in the first direction, the second end of the second conductive line may extend in the second direction.

The second end of the first conductive line may be adjacent to the second end of the second conductive line.

The conductive layer may be spaced apart from the first and second conductive lines.

According to another aspect of the invention, a display device includes a display panel, a conductive sheet disposed under the display panel and including an induction coil wire and a conductive layer spaced apart from the induction coil wire, and a circuit board connected to the induction coil wire.

The induction coil wire may be wound along edges of the display panel.

A thickness of the induction coil wire may be same as a thickness of the conductive layer.

The induction coil wire and the conductive layer may include a same material.

The induction coil wire and the conductive layer may include copper.

The induction coil wire may be configured to generate an induced current based on a change in an external magnetic field.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 14 is a bottom view of another embodiment of the display device of FIG. 1.

DETAILED DESCRIPTION

Figure 1:
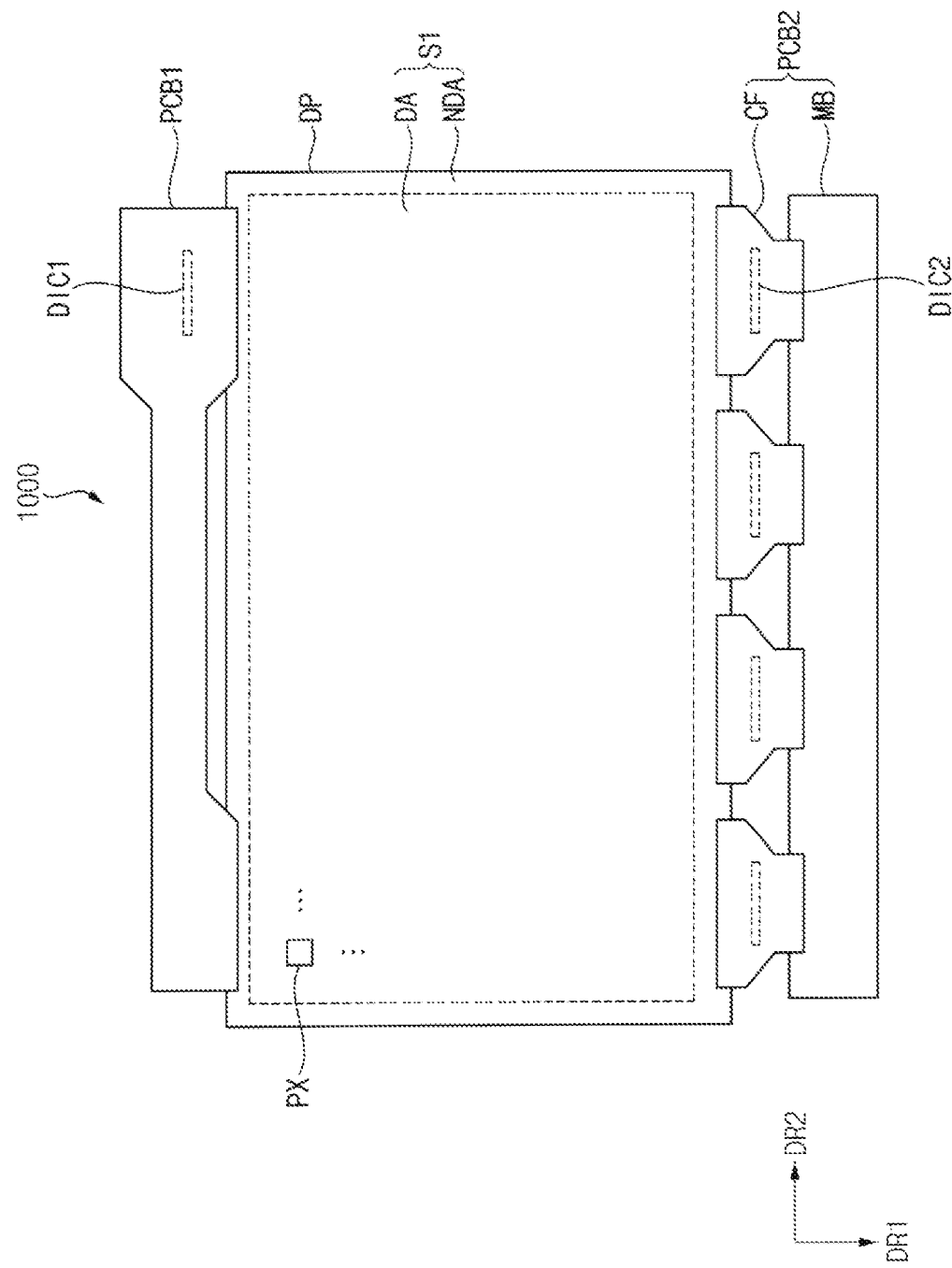
FIG. 1 is a plan view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Illustrative, non-limiting embodiments of the invention will be more clearly understood from the following detailed description in conjunction with the accompanying drawings.

Figure 2:
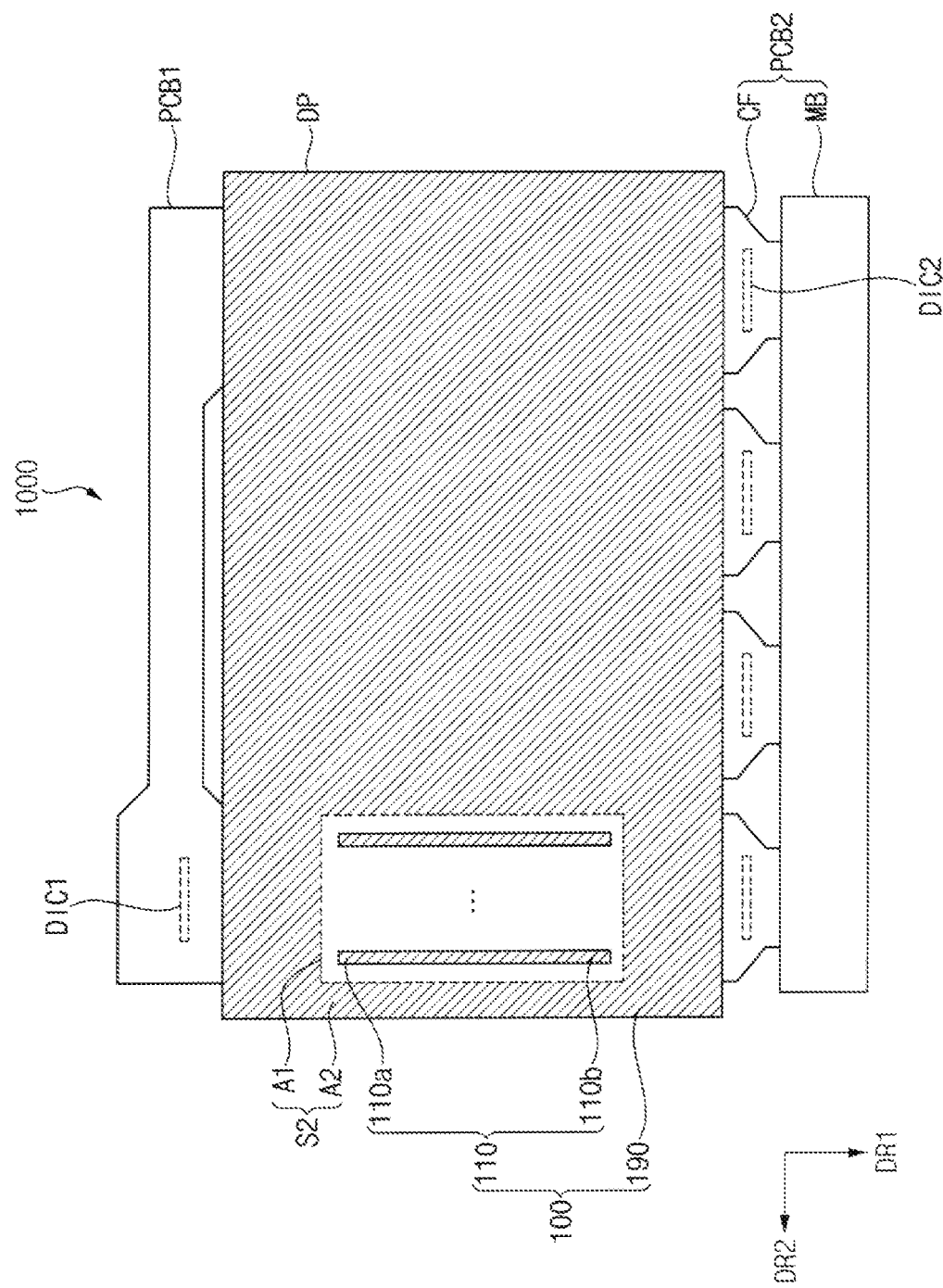
FIG. 2 is a bottom view of the display device of FIG. 1.

FIG. 1 is a plan view illustrating a display device 1000 according to an embodiment. FIG. 2 is a bottom view of the display device 1000 illustrated in FIG. 1.

Referring to FIGS. 1 and 2, a first direction DR1 and a second direction DR2 may define a plane. The first direction DR1 and the second direction DR2 may be substantially perpendicular to each other.

The display device 1000 may include a display panel DP, a first circuit board PCB1, a second circuit board PCB2, and a conductive sheet 100.

The display panel DP may have a first surface S1 and a second surface S2. The first surface S1 may be a front surface of the display panel DP, which may display an image. The second surface S2 may be a rear surface of the display panel DP. Referring to FIG. 1, the first surface S1 of the display panel DP may have a display area DA and a non-display area NDA. The non-display area NDA may surround the display area DA. Referring to FIG. 2, the second surface S2 of the display panel DP may have a first area A1 and a second area A2. The second area A2 may surround the first area A1.

A pixel PX may be disposed in the display area DA of the first surface S1. The pixel PX may be entirely arranged in the display area DA in a matrix form. However, the arrangement of the pixel PX is not limited thereto. For example, the pixel PX may be arranged in the display area DA in various forms.

The pixel PX may emit light. Accordingly, the display area DA of the display panel DP may display an image. The display panel DP may be a quantum dot display panel, an organic light emitting display panel, a liquid crystal display panel, an electrophoretic display panel, a plasma display panel, or the like.

The first and second circuit boards PCB1 and PCB2 may be disposed in the non-display area NDA of the first surface S1. The first and second circuit boards PCB1 and PCB2 may be electrically connected to the display panel DP. The first and second circuit boards PCB1 and PCB2 may be attached to the non-display area NDA. A portion of each of the first and second circuit boards PCB1 and PCB2 may be bent under the display panel DP. For example, the bent portion of each of the first and second circuit boards PCB1 and PCB2 may not be shown in a plan view and may be attached to the second surface S2 of the display panel DP. For example, each of the first and second circuit boards PCB1 and PCB2 may be bent from the first surface S1 to the second surface S2 of the display panel DP.

The first circuit board PCB1 may include a first driving chip DIC1. The first driving chip DIC1 may be electrically connected to the display panel DP. The first driving chip DIC1 may provide various signals to the display panel DP. Accordingly, the display panel DP may perform various functions. For example, the first driving chip DIC1 may provide a touch driving signal to the display panel DP, and the display panel DP may sense a touch of a finger or a pen. The first circuit board PCB1 is illustrated as including one first driving chip DIC1, but embodiments are not limited thereto.

The first circuit board PCB1 may contain a flexible material. For example, the first circuit board PCB1 may contain polyimide. Accordingly, the first circuit board PCB1 may be bent under the display device 1000 so as not to be shown in a plan view. When the first circuit board PCB1 contains the flexible material, the first driving chip DIC1 may have a chip on film (COF) structure.

The second circuit board PCB2 may be spaced apart from the first circuit board PCB1 in the first direction DR1. The second circuit board PCB2 may include a main board MB and a connection film CF. A second driving chip DIC2 may be attached to the connection film CF. For example, the second circuit board PCB2 may further include the second driving chip DIC2. The second driving chip DIC2 may be electrically connected to the display panel DP. The second driving chip DIC2 may provide various signals to the display panel DP. Accordingly, the display panel DP may perform various functions. For example, the second driving chip DIC2 may provide a pixel driving signal to the display panel DP, and the pixel PX of the display panel DP may emit light. The second circuit board PCB2 is illustrated as including one main board MB and four connection films CF attached to the main board MB, but embodiments are not limited thereto.

The main board MB may contain a rigid material, and the connection film CF may contain a flexible material. Accordingly, the connection film CF may be bent under the display device 1000 so as not to be shown in a plan view. Accordingly, the second circuit board PCB2 including the connection film CF and the main board MB may not be shown in a plan view. When the second circuit board PCB2 does not contain the rigid material, the second circuit board PCB2 may have the same structure (e.g., COF structure) as the first circuit board PCB1.

Referring to FIG. 2, the conductive sheet 100 may be disposed on the second surface S2 of the display panel DP. The conductive sheet 100 may be attached to the second surface S2 of the display panel DP. The conductive sheet 100 may include a first conductive line 110 and a conductive layer 190.

The first conductive line 110 may be disposed in the first area A1 of the second surface S2. The first conductive line 110 may extend in the first direction DR1. The conductive layer 190 may be disposed in the second area A2 of the second surface S2.

The conductive sheet 100 may contain a conductive material such as a metal or an alloy. In an embodiment, the conductive sheet 100 may contain copper (Cu). The first conductive line 110 and the conductive layer 190 may contain a same material. The first conductive line 110 and the conductive layer 190 may contain copper. However, a material included in the first conductive line 110 and the conductive layer 190 is not limited thereto. For example, the first conductive line 110 and the conductive layer 190 may be formed of various conductive material.

The first conductive line 110 may be spaced apart from the conductive layer 190. For example, the first conductive line 110 and the conductive layer 190 may not contact each other. The first conductive line 110 and the conductive layer 190 may not be electrically connected. The first conductive line 110 may extend in the first direction DR1 so as not to overlap a boundary between the first and second areas A1 and A2. For example, the first conductive line 110 may extend in the first area A1, and may not extend beyond the first area A1 to the second area A2.

The conductive layer 190 may be disposed in the second area A2. The conductive layer 190 may cover the second area A2. The conductive layer 190 may entirely cover the second area A2.

The conductive layer 190 may be used as a ground, may be used to dissipate heat, and may be used to evenly distribute temperature of the display panel DP.

Figure 3:
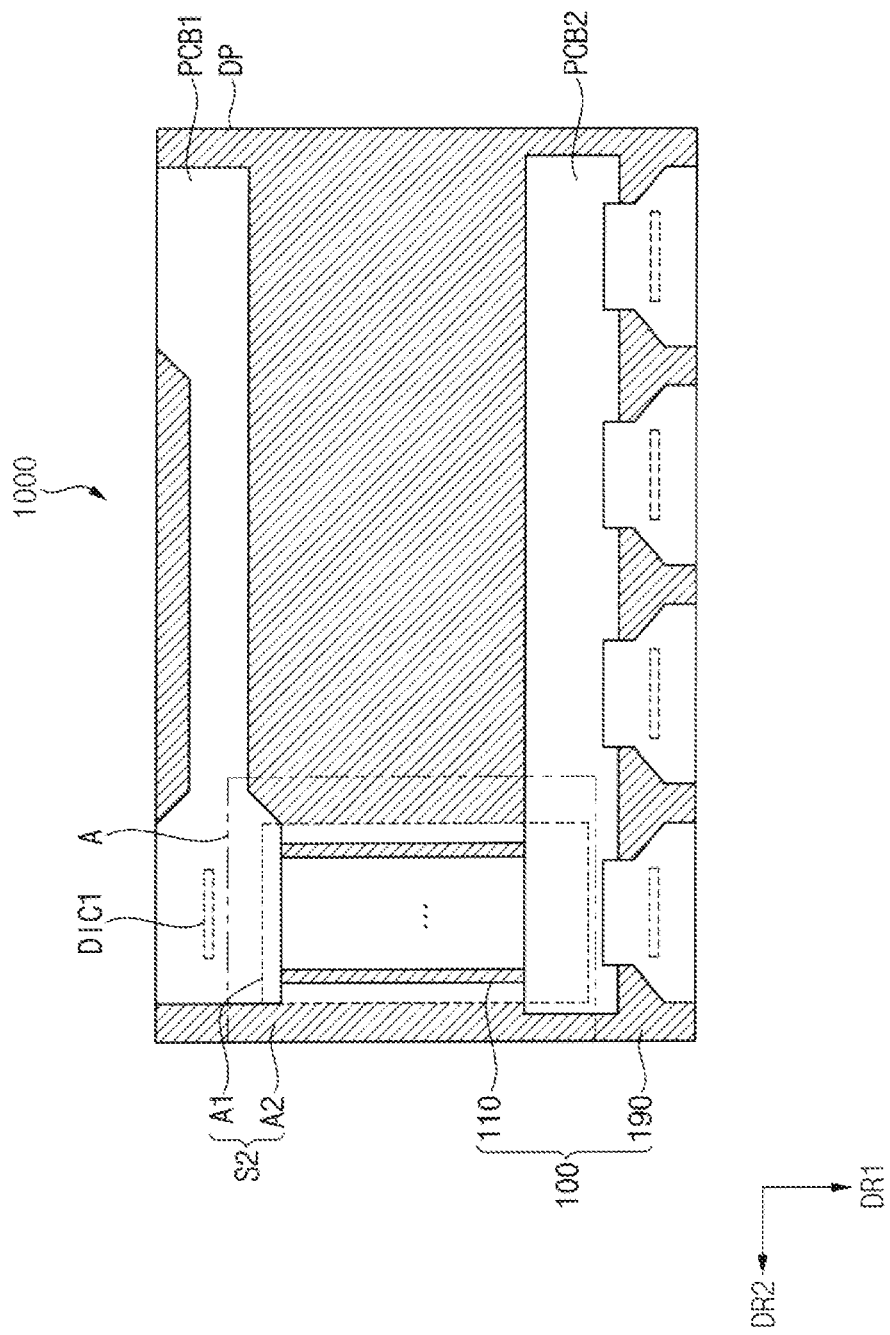
FIG. 3 is bottom view illustrating a state in which first and second circuit boards included in the display device of FIG. 2 are bent.

FIG. 3 is bottom view illustrating a state in which first and second circuit boards PCB1 and PCB2 included in the display device 1000 of FIG. 2 are bent.

Referring to FIGS. 2 and 3, a portion of each of the first and second circuit boards PCB1 and PCB2 may be bent such that the bent portion of each of the first and second circuit boards PCB1 and PCB2 is disposed under the display panel DP. The bent portion of each of the first and second circuit boards PCB1 and PCB2 may be attached to the conductive sheet 100. The first and second circuit boards PCB1 and PCB2 may be spaced apart from each other. The second circuit board PCB2 may be spaced apart from the first circuit board PCB1 in the first direction DR1.

The first circuit board PCB1 may overlap the second area A2. An adhesive layer may be disposed between the first circuit board PCB1 and the conductive layer 190. The first circuit board PCB1 may be attached to the conductive layer 190 through the adhesive layer in the second area A2.

Also, the first circuit board PCB1 may overlap the first area A1. The first circuit board PCB1 may be connected to a first end 110a of the first conductive line 110 under the display panel DP. The first circuit board PCB1 may contact the first end 110a of the first conductive line 110. A connection layer may be disposed between the first circuit board PCB1 and the first end 110a of the first conductive line 110. The connection layer may have conductivity. Accordingly, the connection layer may electrically connect the first circuit board PCB1 and the first conductive line 110. The connection layer may be a conductive paste, a conductive adhesive tape, an anisotropic conductive film, or the like.

The second circuit board PCB2 may overlap the second area A2. The adhesive layer may be disposed between the second circuit board PCB2 and the conductive layer 190. The second circuit board PCB2 may be attached to the conductive layer 190 through the adhesive layer in the second area A2.

Also, the second circuit board PCB2 may overlap the first area A1. The second circuit board PCB2 may be connected to a second end 110b opposite to the first end 110a of the first conductive line 110 under the display panel DP. The second circuit board PCB2 may contact the second end 110b of the first conductive line 110. A connection layer may be disposed between the second circuit board PCB2 and the second end 110b of the first conductive line 110. The connection layer may have conductivity. Accordingly, the connection layer may electrically connect the second circuit board PCB2 and the first conductive line 110. The connection layer may be a conductive paste, a conductive adhesive tape, an anisotropic conductive film, or the like.

The first and second circuit boards PCB1 and PCB2 may be electrically connected through the first conductive line 110. The conductive sheet 100 may include the conductive layer 190. For example, the conductive layer may be used as a ground, used to dissipate heat, and used to evenly distribute temperature of the display panel DP and the first conductive line 110. For example, the first conductive line 110 may be used to electrically connect the first and second circuit boards PCB1 and PCB2.

Figure 4:
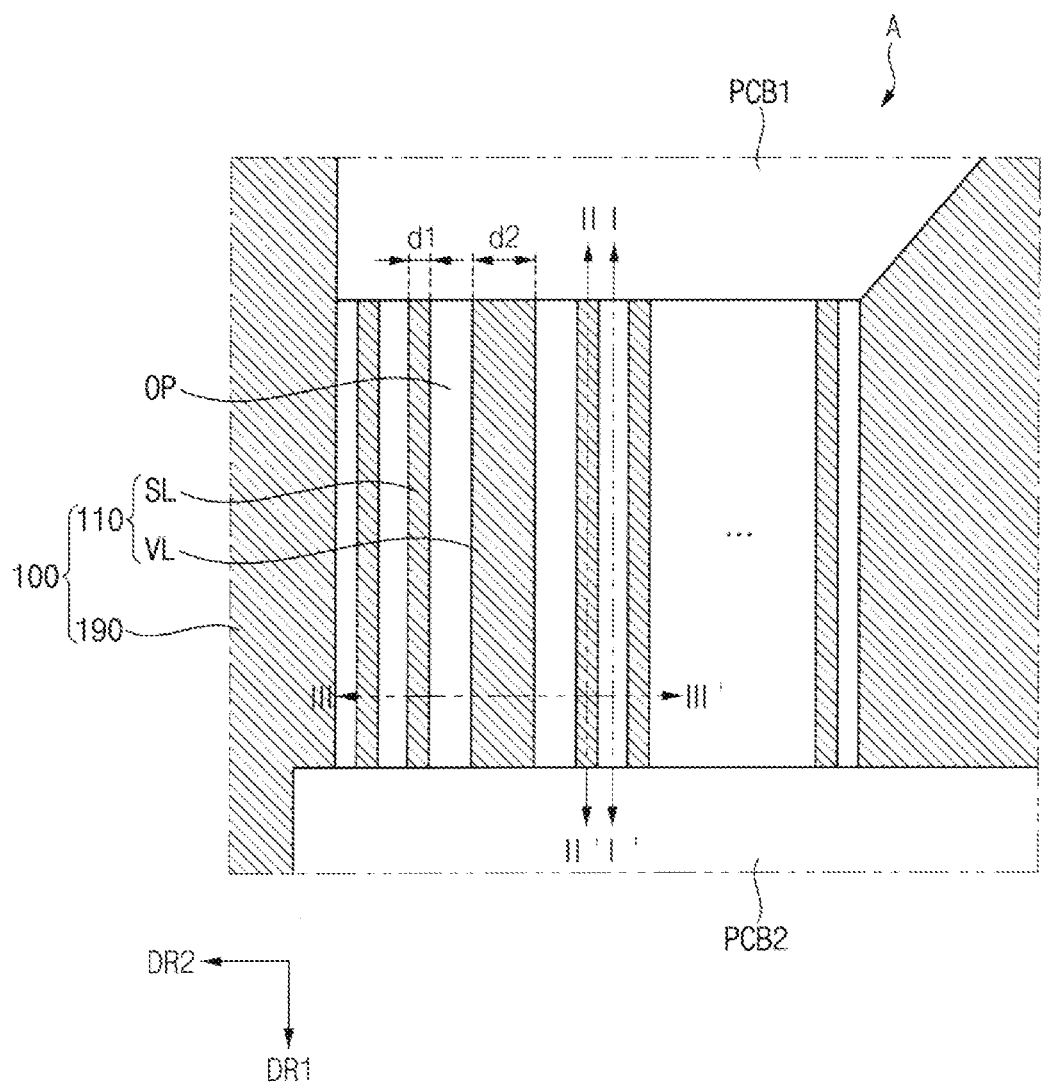
FIG. 4 is an enlarged bottom view of portion 'A' of FIG. 3.

FIG. 4 is an enlarged bottom view of portion 'A' of FIG. 3.

Referring to FIG. 4, the first conductive line 110 may include a plurality of connection lines spaced apart from each other in the second direction DR2 intersecting the first direction DR1. The plurality of connection lines may include a signal line SL and a power line VL. The first conductive line 110 may include the signal line SL and the power line VL that are spaced apart from each other. The width d2 of the power line VL may be greater than the width d1 of the signal line SL.

The first and second circuit boards PCB1 and PCB2 may be electrically connected through the signal line SL. The signal line SL may transmit various signals transmitted between the first and second circuit boards PCB1 and PCB2. For example, the signal line SL may transmit a clock signal, a data signal, the touch driving signal, or the like. The signal line SL may transmit the various signals from the first circuit board PCB1 to the second circuit board PCB2 or from the second circuit board PCB2 to the first circuit board PCB1.

The first and second circuit boards PCB1 and PCB2 may be electrically connected through the power line VL. The power line VL may transmit various power voltages transmitted between the first and second circuit boards PCB1 and PCB2. For example, the power line VL may transmit a high power voltage, a low power voltage, a reference voltage, a ground voltage, or the like. The power line VL may transmit the various power voltages from the first circuit board PCB1 to the second circuit board PCB2 or from the second circuit board PCB2 to the first circuit board PCB1.

Figure 5:
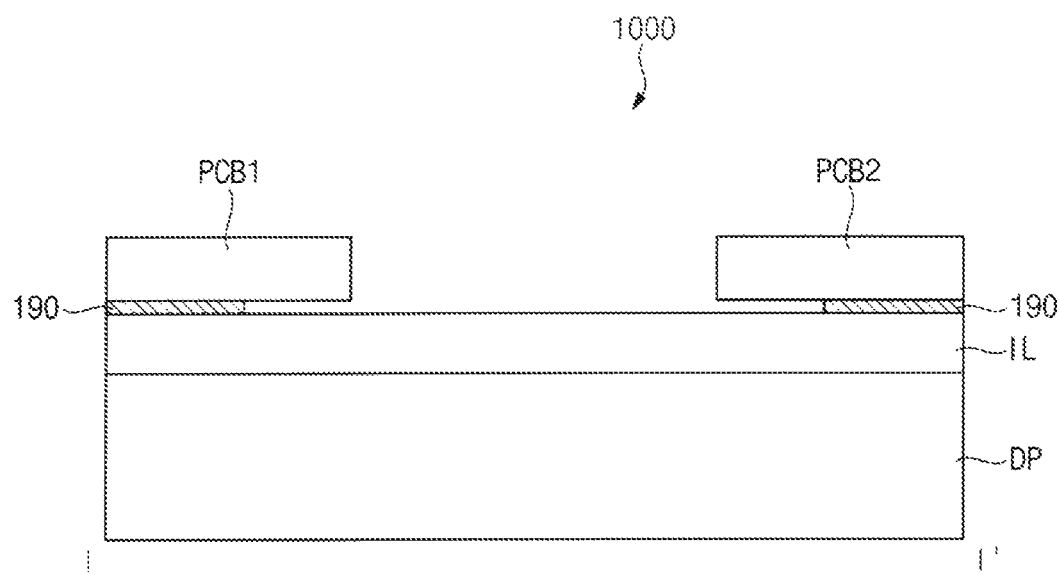
FIG. 5 is a cross-sectional view taken along line I-I' of FIG. 4.

FIG. 5 is a cross-sectional view taken along line I-I' of FIG. 4.

Referring to FIGS. 4 and 5, the display device 1000 may further include an insulating layer IL. The insulating layer IL may be disposed between the display panel DP and the conductive sheet 100 (e.g., the first conductive line 110 and the conductive layer 190). The insulating layer IL may insulate between a portion and another portion of the conductive layer 190 that are spaced apart from each other. For example, the display device 1000 may further include a protective sheet disposed between the display panel DP and the insulating layer IL.

Each of the first and second circuit boards PCB1 and PCB2 may be attached to the conductive layer 190. For example, an adhesive layer may be disposed between each of the first and second circuit boards PCB1 and PCB2 and the conductive layer 190.

Figure 6:
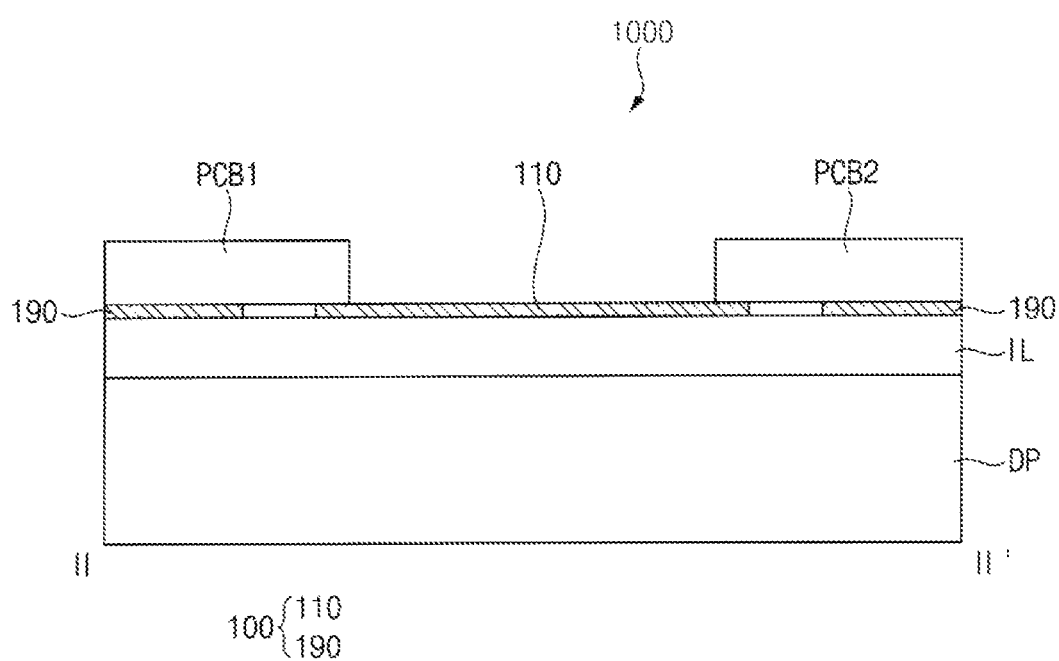
FIG. 6 is a cross-sectional view taken along line II-II' of FIG. 4.

FIG. 6 is a cross-sectional view taken along line II-II' of FIG. 4.

Referring to FIGS. 4 and 6, each of the first and second circuit boards PCB1 and PCB2 may be attached to the conductive sheet 100. Each of the first and second circuit boards PCB1 and PCB2 may be attached to the first conductive line 110 and the conductive layer 190. For example, an adhesive layer may be disposed between each of the first and second circuit boards PCB1 and PCB2 and the conductive layer 190, and a connection layer may be disposed between each of the first and second circuit boards PCB1 and PCB2 and the first conductive line 110.

The first conductive line 110 and the conductive layer 190 may be spaced apart from each other, e.g., in the first direction DR1. The signals and the power voltages transmitted between the first and second circuit boards PCB1 and PCB2 through the first conductive line 110 may not be transmitted to the conductive layer 190. The thickness of the first conductive line 110 may be substantially same as the thickness of the conductive layer 190.

The insulating layer IL may block the signals and the power voltages from being transmitted from the first conductive line 110 to the conductive layer 190.

Figure 7:
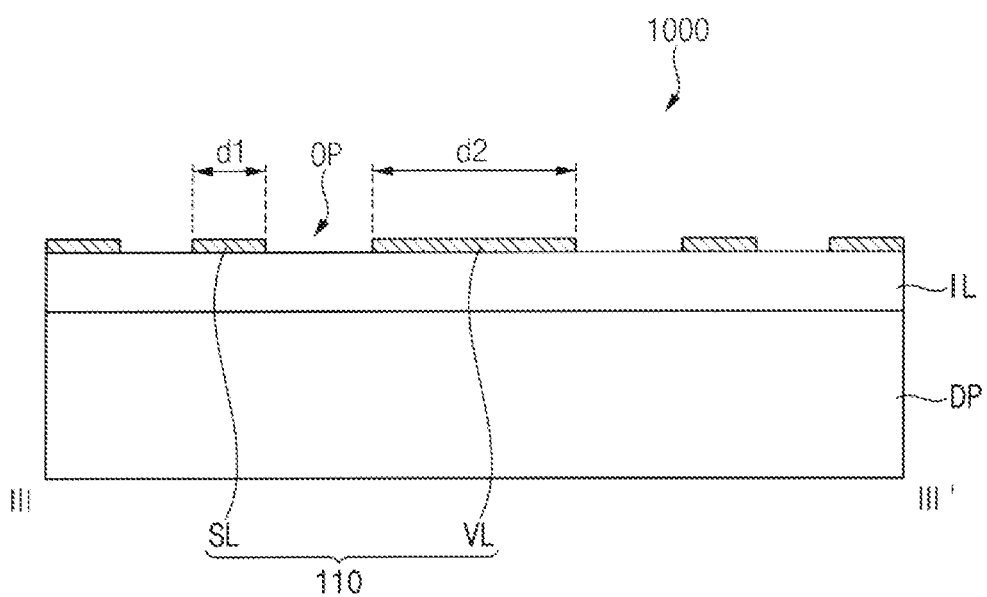
FIG. 7 is a cross-sectional view taken along line III-III' of FIG. 4.

FIG. 7 is a cross-sectional view taken along line III-III' of FIG. 4.

Referring to FIGS. 4 and 7, the first conductive line 110 may include a plurality of connection lines, and the plurality of connection lines may include the signal line SL and the power line VL.

The plurality of connection lines may be spaced apart from each other, e.g., in the second direction DR2. An opening OP may be formed between the plurality of connection lines. The insulating layer IL may be exposed through the opening OP. Accordingly, the plurality of connection lines may not be electrically connected to each other by the insulating layer IL and the opening OP.

The signal line SL may transmit the various signals, and the power line VL may transmit the various power voltages. The signals and the power voltages may require different impedances. As the required impedances of the signals and the power voltages are different, the width d2 of the power line VL may be greater than the width d1 of the signal line SL.

The conductive sheet 100 may be used as a ground, may be used to dissipate heat, and may be used to evenly distribute temperature of the display panel DP, and may also be used to transmit the signals and the power voltages between the first and second circuit boards PCB1 and PCB2. Accordingly, the display device 1000 including the conductive sheet 100 may not require a separate connection circuit board for connecting the first and second circuit boards PCB1 and PCB2 under the display panel DP. Thus, a required area of the connection circuit board may be reduced. As the connection circuit board is not required, the cost of the display device 1000 may be reduced, and the thickness and the weight of the display device 1000 may be reduced or minimized.

Figure 8:
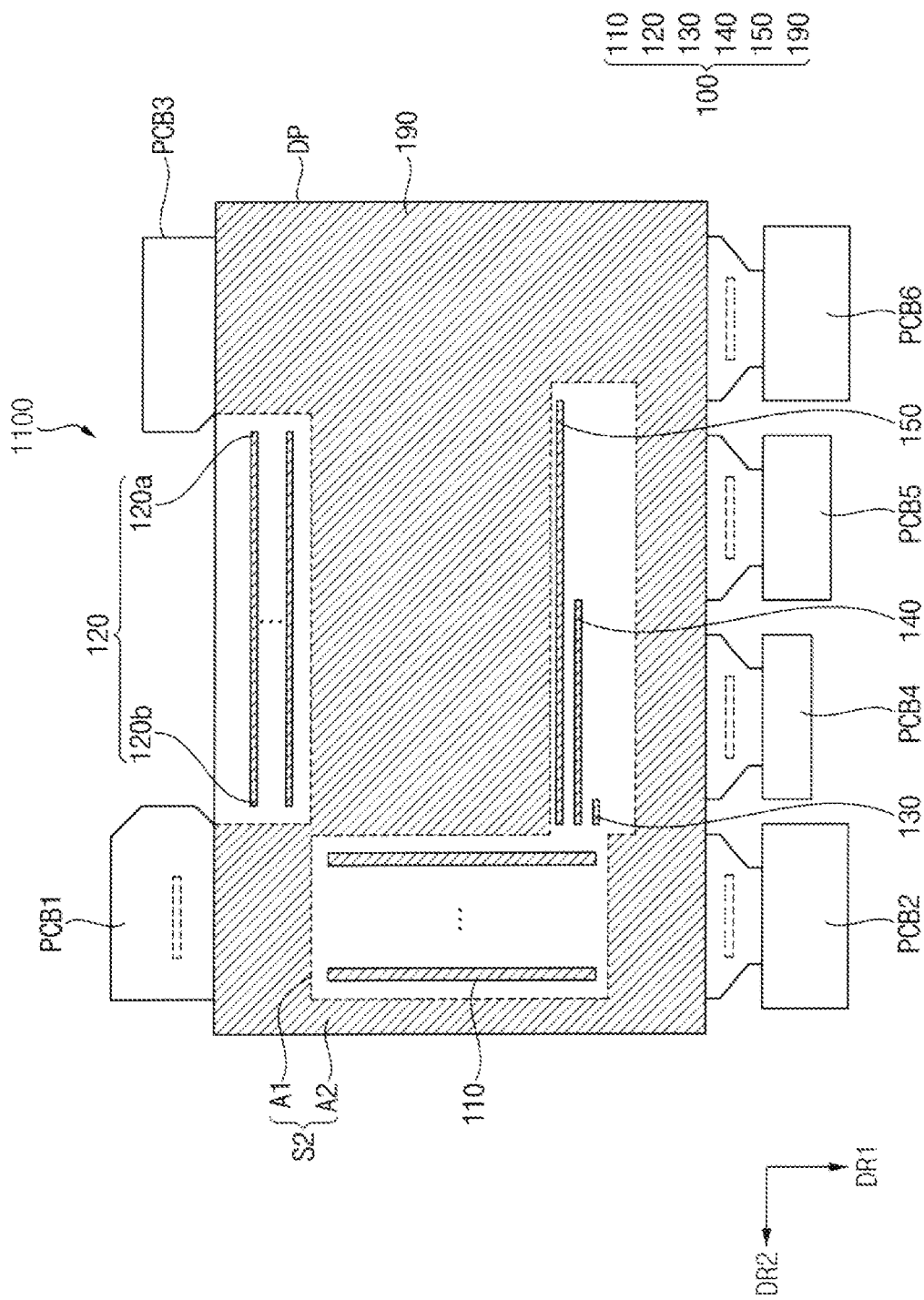
FIG. 8 is a bottom view of another embodiment of the display device of FIG. 1.
Figure 9:
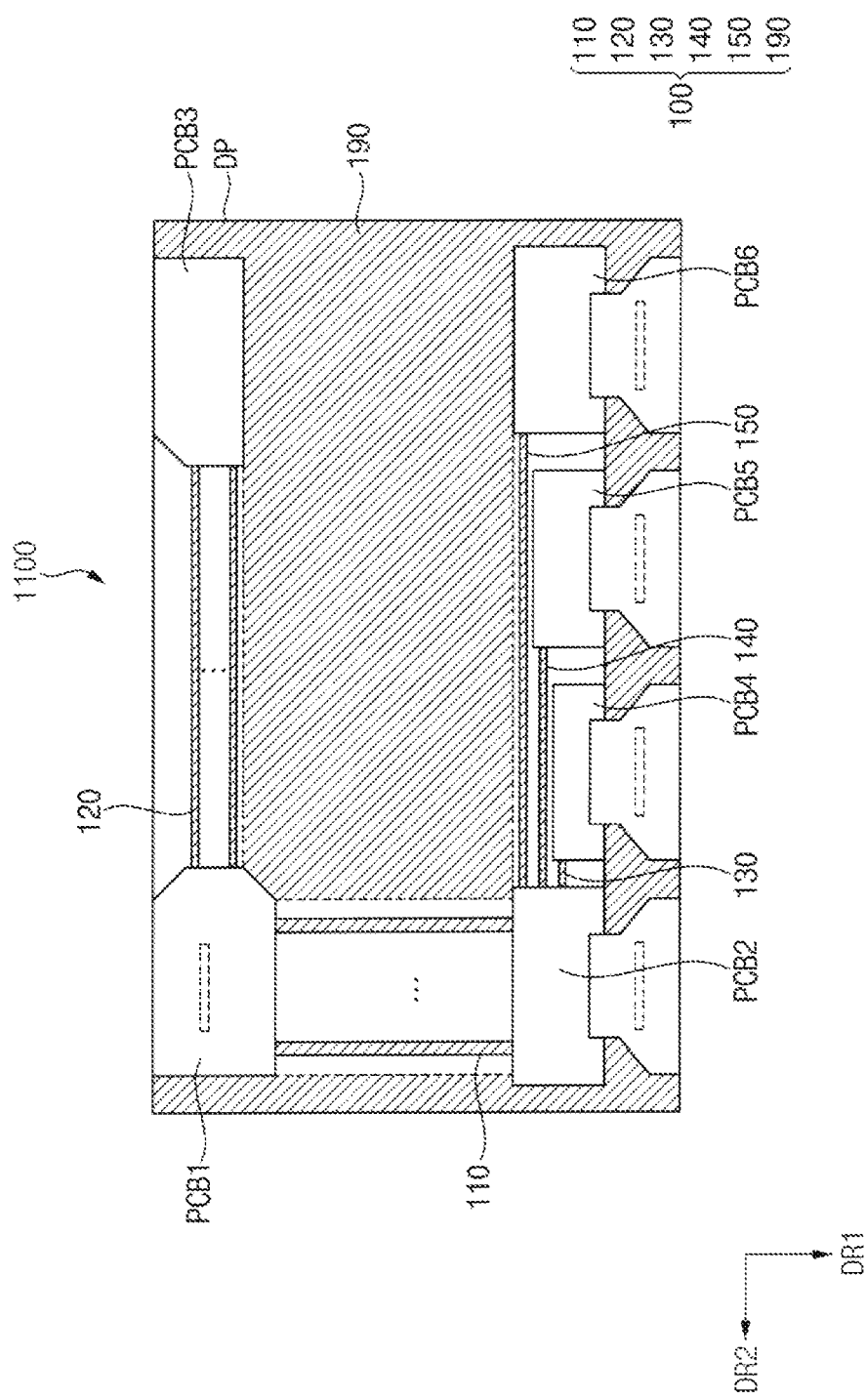
FIG. 9 is bottom view illustrating a state in which first to sixth circuit boards included in the display device of FIG. 8 are bent.

FIG. 8 is a bottom view illustrating a display device 1100 according to another embodiment. FIG. 9 is bottom view illustrating a state in which first, second, third, fourth, fifth, and sixth circuit boards PCB1, PCB2, PCB3, PCB4, PCB5, and PCB6 included in the display device 1100 of FIG. 8 are bent. Among the components of the display device 1100 of FIG. 9, the same reference numerals are used for the same components as those of the display device 1000 of FIG. 1, and duplicate descriptions of the same components will be omitted for descriptive convenience.

Referring to FIGS. 8 and 9, the display device 1100 may include the display panel DP, the conductive sheet 100, the first circuit board PCB1, the second circuit board PCB2, and a third circuit board PCB3.

A portion of each of the first, second, and third circuit boards PCB1, PCB2, and PCB3 is attached to the first surface S1 of the display panel DP, and another portion may be bent and may be attached to the second surface S2 of the display panel DP. The second circuit board PCB2 may be spaced apart from the first circuit board PCB1 in the first direction DR1. The third circuit board PCB3 may be spaced apart from the first circuit board PCB1 in a direction opposite to the second direction DR2.

The conductive sheet 100 may include the first conductive line 110, a second conductive line 120, and the conductive layer 190.

The second conductive line 120 may be disposed in the second area A2. The second conductive line 120 may extend in the second direction DR2 intersecting the first direction DR1. The second conductive line 120 may be disposed between the first and third circuit boards PCB1 and PCB3. The second conductive line 120 may be spaced apart from the conductive layer 190, e.g., in the first direction DR1. The conductive layer 190 may be disposed in a portion of the second area A2 by being spaced apart from the second conductive line 120 disposed in the second area A2.

The third circuit board PCB3 may be connected to a first end 120a of the second conductive line 120 under the display panel DP. A connection layer may be disposed between the third circuit board PCB3 and the first end 120a of the second conductive line 120. The connection layer may have conductivity. Accordingly, the connection layer may electrically connect the third circuit board PCB3 and the second conductive line 120. The connection layer may be a conductive paste, a conductive adhesive tape, an anisotropic conductive film, or the like.

The first circuit board PCB1 may be connected to a second end 120b opposite to the first end 120a of the second conductive line 120 under the display panel DP. A connection layer may be disposed between the first circuit board PCB1 and the second end 120b of the second conductive line 120. The connection layer may have conductivity. Accordingly, the connection layer may electrically connect the first circuit board PCB1 and the second conductive line 120 to each other. The connection layer may be a conductive paste, a conductive adhesive tape, an anisotropic conductive film, or the like.

Accordingly, the first and third circuit boards PCB1 and PCB3 may be electrically connected through the second conductive line 120.

Also, the display device 1100 may further include fourth, fifth, and sixth circuit boards PCB4, PCB5, and PCB6. The fourth, fifth, and sixth circuit boards PCB4, PCB5, and PCB6 may be sequentially spaced apart from the second circuit board PCB2 in the direction opposite to the second direction DR2.

The third, fourth, and fifth conductive lines 130, 140, and 150 may be spaced apart from the conductive layer 190. The third conductive line 130 may be disposed between the second and fourth circuit boards PCB2 and PCB4 and may electrically connect the second and fourth circuit boards PCB2 and PCB4 to each other. The fourth conductive line 140 may be disposed between the second and fifth circuit boards PCB2 and PCB5 and may electrically connect the second and fifth circuit boards PCB2 and PCB5 to each other. The fifth conductive line 150 may be disposed between the second and sixth circuit boards PCB2 and PCB6 and electrically connect the second and sixth circuit boards PCB2 and PCB6 to each other.

As the conductive sheet 100 includes the first, second, third, fourth, and fifth conductive lines 110, 120, 130, 140, and 150, an area where the first, second, third, fourth, fifth, and sixth circuit boards PCB1, PCB2, PCB3, PCB4, PCB5, and PCB6 are attached to the second surface S2 of the display panel DP may be reduced. Thus, the required area of the circuit board may be minimized. Accordingly, the cost of the display device 1100 may be reduced, and the thickness and the weight of the display device 1100 may be reduced or minimized.

Figure 10:
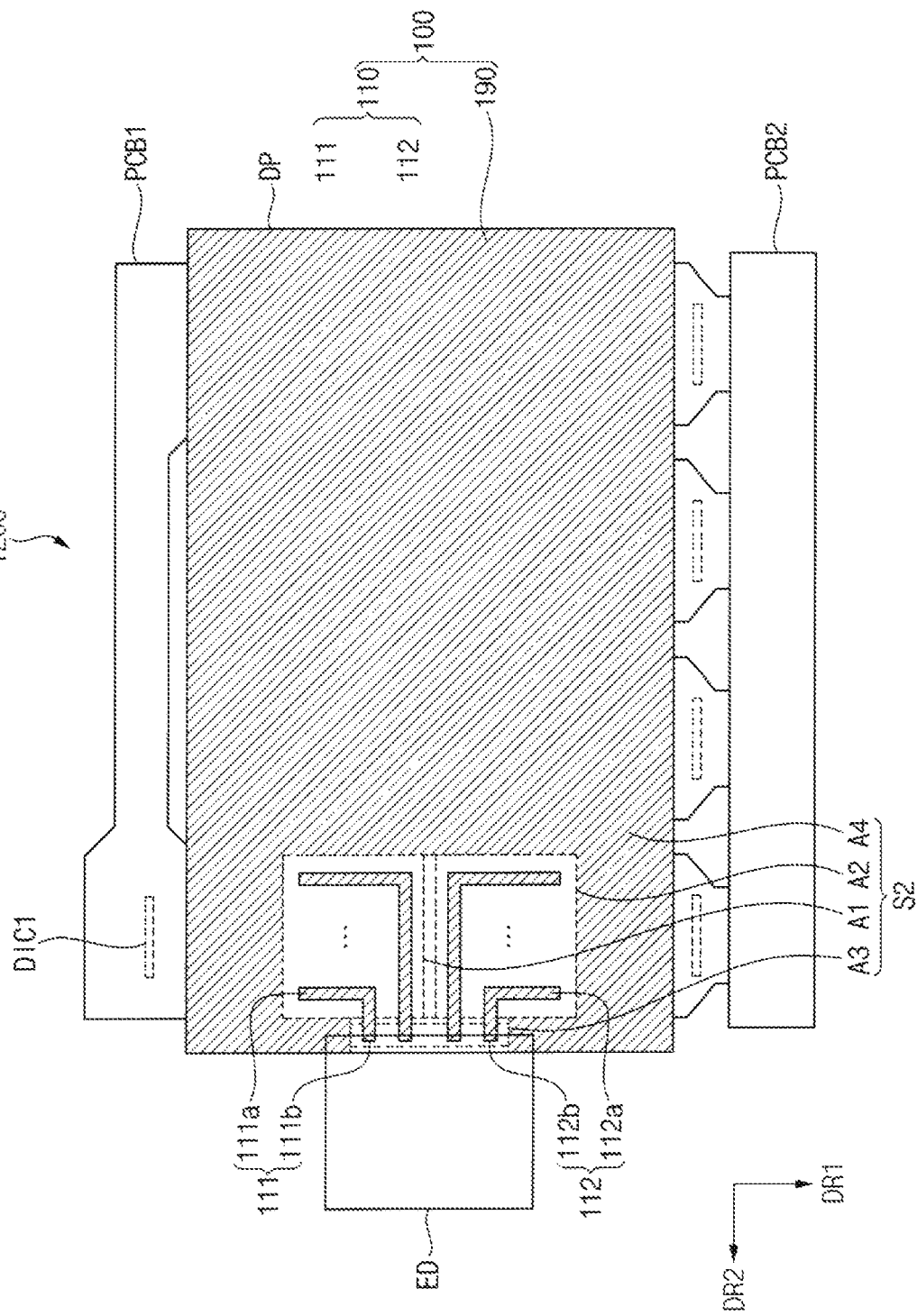
FIG. 10 is a bottom view of another embodiment of the display device of FIG. 1.
Figure 11:
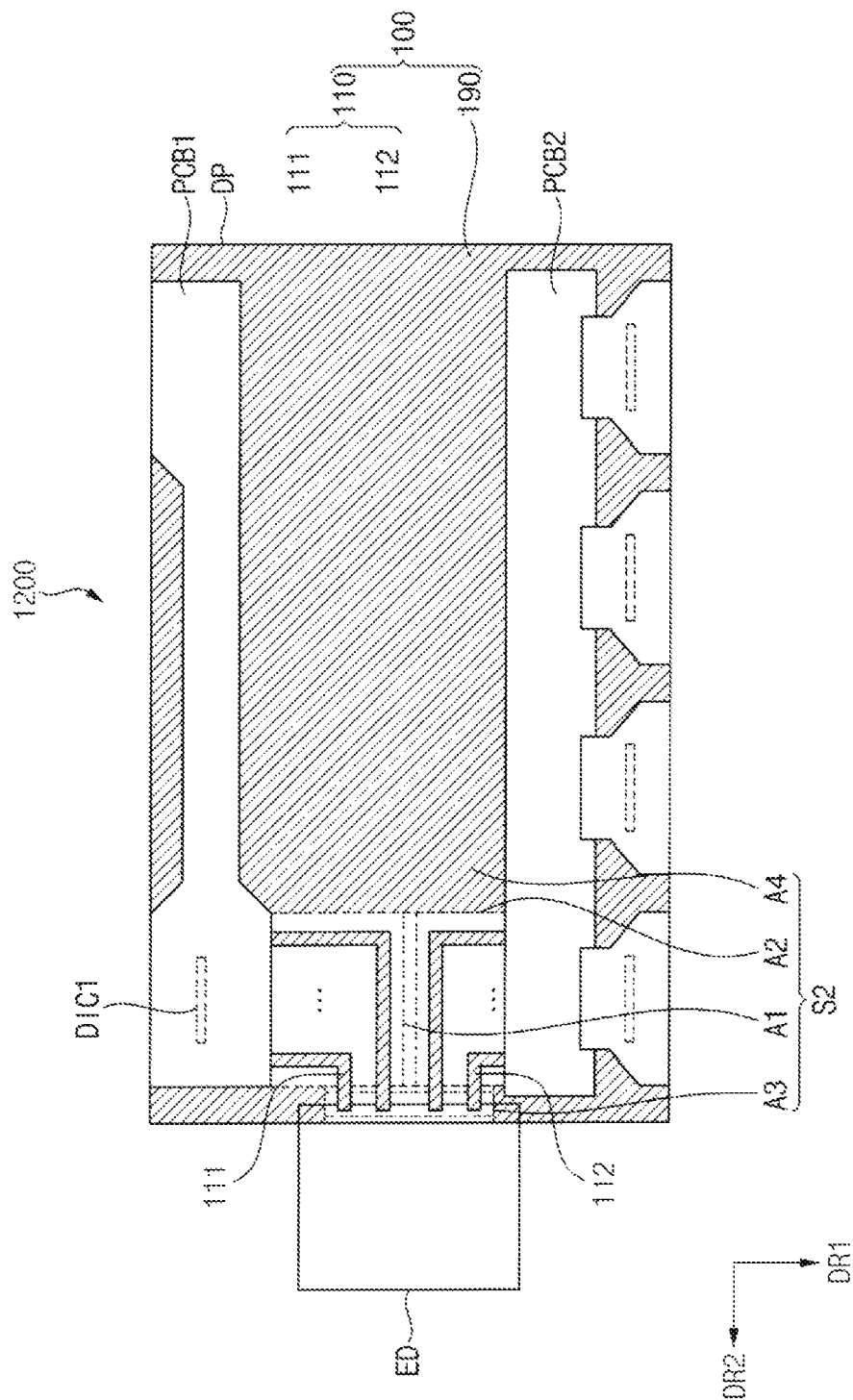
FIG. 11 is bottom view illustrating a state in which first and second circuit boards included in the display device of FIG. 10 are bent.

FIG. 10 is a bottom view illustrating a display device 1200 according to another embodiment. FIG. 11 is bottom view illustrating a state in which first and second circuit boards PCB1 and PCB2 included in the display device 1200 of FIG. 10 are bent. Among the components of the display device 1200 of FIG. 10, the same reference numerals are used for the same components as those of the display device 1000 of FIG. 1, and duplicate descriptions of the same components will be omitted for descriptive convenience.

Referring to FIGS. 10 and 11, the display device 1200 may include the display panel DP, the conductive sheet 100, the first circuit board PCB1, the second circuit board PCB2, and an external device ED.

The display panel DP may have first, second, third, and fourth areas A1, A2, A3, and A4. The second surface S2 of the display panel DP may have first, second, third, and fourth areas A1, A2, A3, and A4. The second area A2 may be adjacent to the first area A1 in the first direction DR1. The third area A3 may be adjacent to the first and second areas A1 and A2 in the second direction DR2 intersecting the first direction DR1. The fourth area A4 may surround the first, second, and third areas A1, A2, and A3.

The first and second areas A1 and A2 may be adjacent to each other in the first direction DR1. The third area A3 may be adjacent to each of the first and second areas A1 and A2 in the second direction DR2. The third area A3 may be disposed between each of the first and second areas A1 and A2 and an edge of the display panel DP. The fourth area A4 may be an area of the second surface S2 of the display panel DP except for the first, second, and third areas A1, A2, and A3.

The length of the third area A3 in the first direction DR1 may be smaller than the length of a short side of the display panel DP.

The conductive sheet 100 may include a first conductive line 111, a second conductive line 112, and a conductive layer 190.

A first end 111a of the first conductive line 111 may be disposed in the first area A1. A second end 111b opposite to the first end 111a of the first conductive line 111 may be disposed in the third area A3. For example, the first conductive line 111 may be disposed in the first and third areas A1 and A3.

A first end 112a of the second conductive line 112 may be disposed in the second area A2. A second end 112b opposite to the first end 112a of the second conductive line 112 may be disposed in the third area A3. For example, the second conductive line 112 may be disposed in the second and third areas A2 and A3.

The conductive layer 190 may be disposed in the fourth area A4. For example, the conductive layer 190 may be spaced apart from the first and second conductive lines 111 and 112.

The first circuit board PCB1 may be connected to the first end 111a of the first conductive line 111. The first circuit board PCB1 may be connected to the first end 111a of the first conductive line 111 under the conductive sheet 100.

The second circuit board PCB2 may be connected to the first end 112a of the second conductive line 112. The second circuit board PCB2 may be bent under the conductive sheet 100 such that the second circuit board PCB2 is connected to the first end 112a of the second conductive line 112.

The external device ED may be connected to the display panel DP. The external device ED may overlap at least a portion of the display panel DP to be electrically connected to the display panel DP. The external device ED may overlap the third area A3 of the display panel DP. For example, the third area A3 may be an area in which the display panel DP and the external device ED are connected. The external device ED may be bent under the conductive sheet 100 such that the external device ED is connected to the second end 111b of the first conductive line 111 and the second end 112b of the second conductive line 112.

The first end 111a of the first conductive line 111 may extend in the first direction DR1, and the second end 111b of the first conductive line 111 may extend in the second direction DR2. The first end 112a of the second conductive line 112 may extend in the first direction DR1, and the second end 112b of the second conductive line 112 may extend in the second direction DR2. The second end 111b of the first conductive line 111 may be adjacent to the second end 112b of the second conductive line 112.

However, the extending directions of the first and second conductive lines 111 and 112 are not limited thereto. For example, the first conductive line 111 may extend in various directions to connect the first circuit board PCB1 and the external device ED. For example, the second conductive line 112 may extend in various directions to connect the second circuit board PCB2 and the external device ED. In addition, the extending directions of the first and second conductive lines 111 and 112 may be varied or modified to minimize a size of the third area A3 that is an area connected to the external device ED. For example, only one connector for connecting the external device ED and the first and second circuit boards PCB1 and PCB2 may be provided corresponding to the third area A3. As a separate circuit board connecting the first and second circuit boards PCB1 and PCB2 and the external device ED is not required, the cost of the display device 1200 may be reduced and the thickness and the weight of the display device 1200 may be reduced or minimized.

Figure 12:
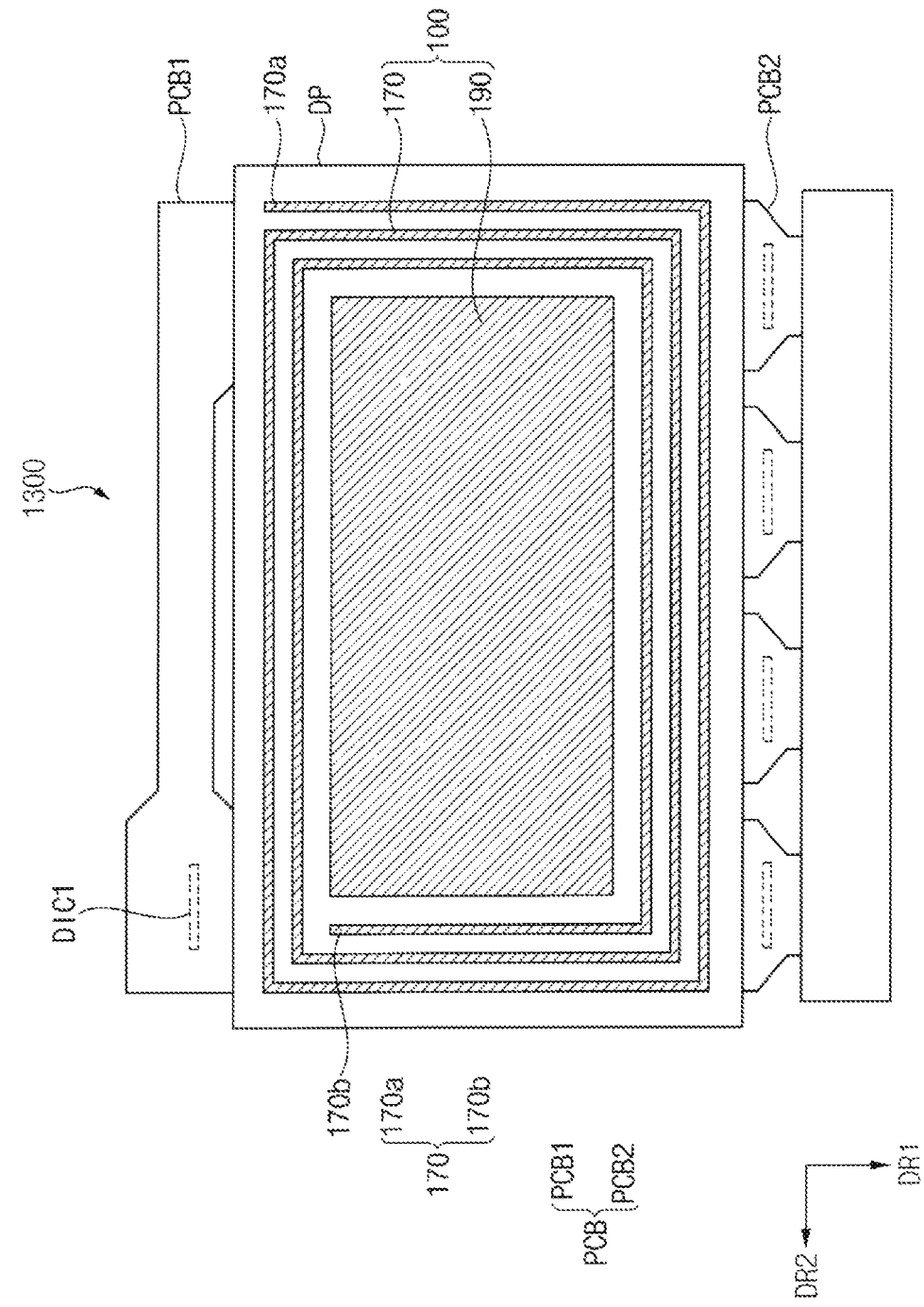
FIG. 12 is a bottom view of another embodiment of the display device of FIG. 1.
Figure 13:
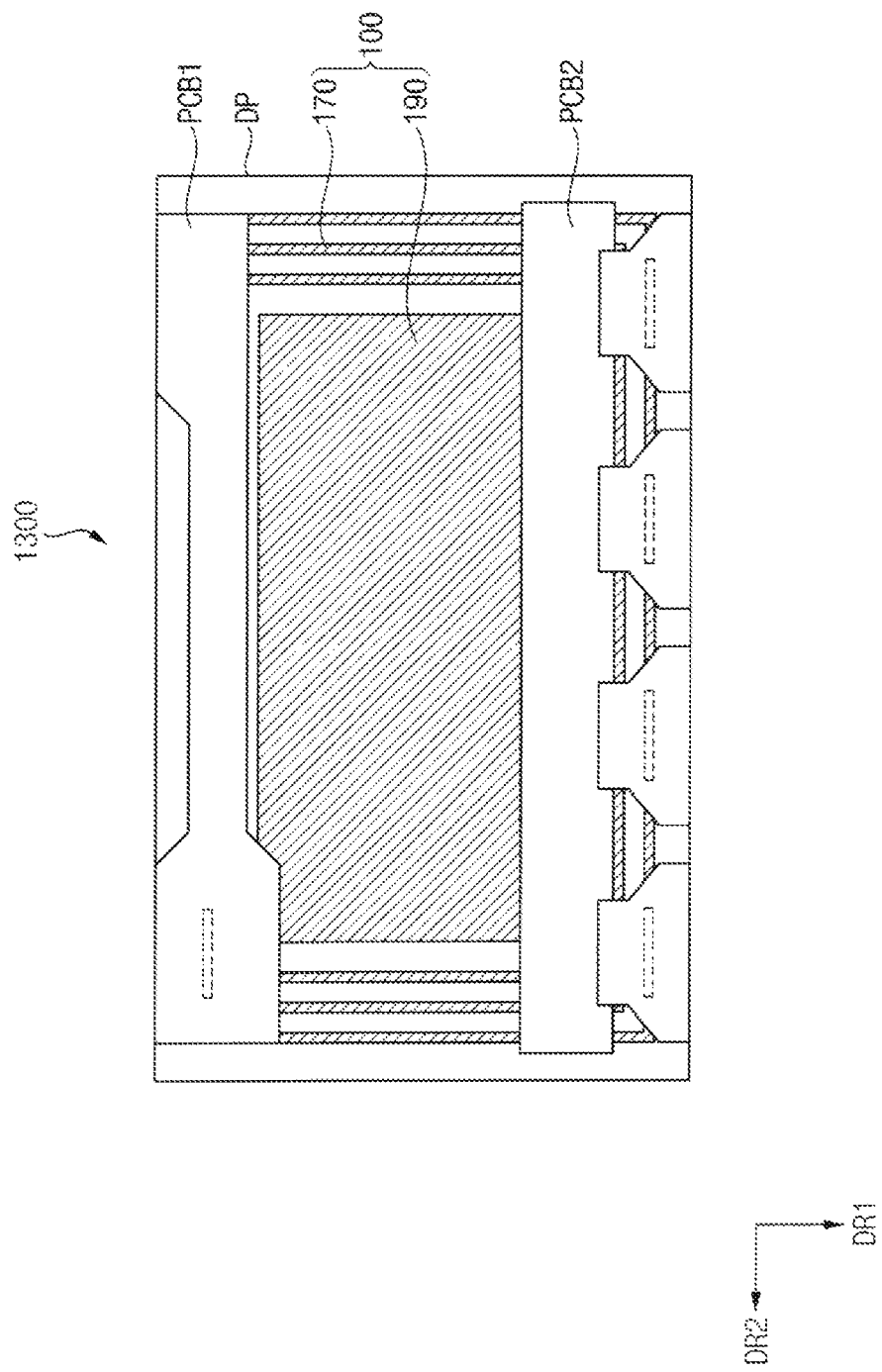
FIG. 13 is bottom view illustrating a state in which first and second circuit boards included in the display device of FIG. 12 are bent.

FIG. 12 is a bottom view illustrating a display device 1300 according to another embodiment. FIG. 13 is bottom view illustrating a state in which first and second circuit boards PCB1 and PCB2 included in the display device 1300 of FIG. 12 are bent. Among the components of the display device 1300 of FIG. 12, the same reference numerals are used for the same components as those of the display device 1000 of FIG. 1, and duplicate descriptions of the same components will be omitted for descriptive convenience.

Referring to FIGS. 12 and 13, the display device 1300 may include the display panel DP, a circuit board PCB, and a conductive sheet 100.

The circuit board PCB may include first and second circuit boards PCB1 and PCB2. The first and second circuit boards PCB1 and PCB2 may be spaced apart from each other in the first direction DR1.

The conductive sheet 100 may be attached to the second surface S2 of the display panel DP. The conductive sheet 100 may include an induction coil wire 170 and a conductive layer 190.

The induction coil wire 170 may be spaced apart from the conductive layer 190. For example, the induction coil wire 170 and the conductive layer 190 may not contact each other. The induction coil wire 170 and the conductive layer 190 may not be electrically connected. The thickness of the induction coil wire 170 may be same as the thickness of the conductive layer 190.

The conductive sheet 100 may contain a conductive material such as a metal or an alloy. In an embodiment, the conductive sheet 100 may contain copper (Cu). The induction coil wire 170 and the conductive layer 190 may contain the same material. For example, the induction coil wire 170 and the conductive layer 190 may contain copper. However, the material included in the induction coil wire 170 and the conductive layer 190 is not limited thereto. For example, the material may include various conductive materials.

The circuit board PCB may be bent under the conductive sheet 100 to be connected to the induction coil wire 170. The circuit board PCB may be electrically connected to a first end 170a of the induction coil wire 170 and a second end 170b opposite to the first end 170a of the induction coil wire 170. A connection layer may be disposed between the first circuit board PCB1 and the first end 170a of the induction coil wire 170 and between the first circuit board PCB1 and the second end 170b of the induction coil wire 170. The connection layer may have conductivity. Accordingly, the connection layer may electrically connect the first circuit board PCB1 and the induction coil wire 170. The connection layer may be a conductive paste, a conductive adhesive tape, an anisotropic conductive film, or the like.

The induction coil wire 170 may be wound along the edge of the display panel DP. In this case, the conductive layer 190 may be disposed in a central portion of the display panel DP to be spaced apart from the induction coil wire 170. The induction coil wire 170 may be arranged along the edge of the display panel DP, and may be wound with a preset number of turns in a preset winding direction. The winding direction may be clockwise or counterclockwise. The preset number of turns may be greater than one, but is not limited thereto, and the preset number of turns may be one.

The induction coil wire 170 may generate an induced current based on a change in an external magnetic field. The magnetic field outside the induction coil wire 170 may change. An electromagnetic induction phenomenon may occur due to the change in the external magnetic field. Accordingly, the induction coil wire 170 may generate the induced current by the electromagnetic induction phenomenon.

The induced current may be used as a charging current. For example, the induced current may charge a touch pen for inputting data into the display device 1300.

For example, the conductive sheet 100 may include the conductive layer 190. For example, the conductive layer 190 may be used as a ground, used to dissipate heat, and used to evenly distribute temperature of the display panel DP and the induction coil wire 170 that is used to generate the induced current for charging a charging target device, such as the touch pen. For example, the display device 1300 may not include a separate charging socket for charging the charging target device. Accordingly, the cost of the display device 1300 may be reduced, and the thickness and the weight of the display device 1300 may be reduced or minimized.

Figure 15:
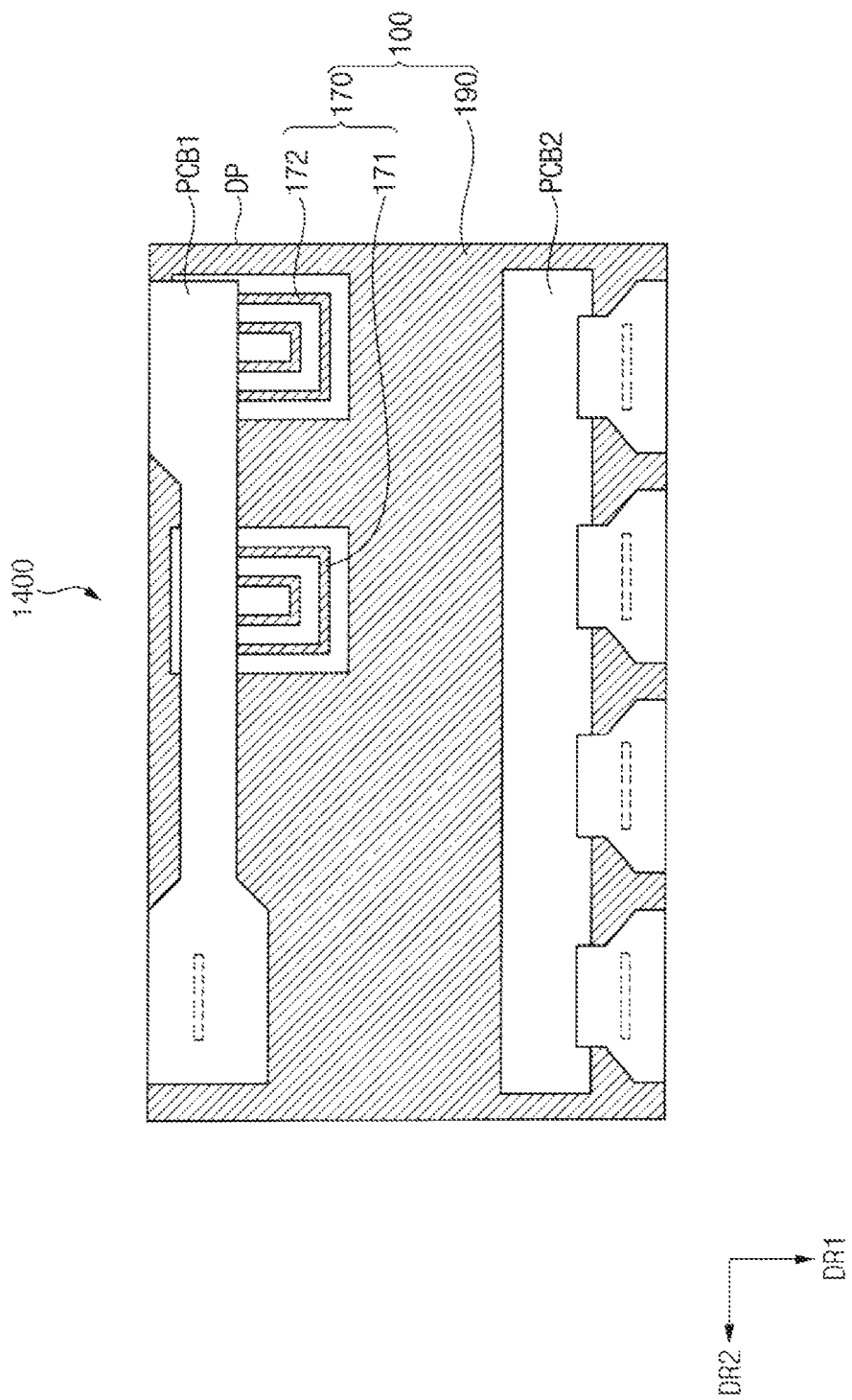
FIG. 15 is bottom view illustrating a state in which first and second circuit boards included in the display device of FIG. 14 are bent.

FIG. 14 is a bottom view illustrating a display device 1400 according to another embodiment. FIG. 15 is bottom view illustrating a state in which first and second circuit boards PCB1 and PCB2 included in the display device 1400 of FIG. 14 are bent. Among the components of the display device 1400 of FIG. 14, the same reference numerals are used for the same components as those of the display device 1300 of FIG. 12, and duplicate descriptions of the same components will be omitted for descriptive convenience.

Referring to FIGS. 14 and 15, the induction coil wire 170 may include first and second induction coil wires 171 and 172. For example, the induction coil wire 170 may be provided in plurality. In addition, a position of the induction coil wire 170 is not limited thereto.

The first induction coil wire 171 may be wound with a first number of turns in a first winding direction in a preset area. The second induction coil wire 172 may be wound with a second number of turns in a second winding direction in a preset area.

For example, the induction coil wire 170 may be disposed at positions where the charging target devices, such as the touch pen, require charging.

Embodiments are to improve usability of the conductive sheet by using a patterned conductive sheet to form conductive line and induction coil wire. For example, the conductive sheet may perform other functions while performing the ground role, heat dissipation role, and a role of evenly distributing temperature of the display panel. Accordingly, those skilled in the art will understand that the conductive sheet may include all of the conductive layer, the conductive line, and the induction coil wire.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel comprising a first surface and a second surface opposite to the first surface, the second surface having a first area and a second area surrounding the first area;
    a conductive sheet disposed on the second surface of the display panel, the conductive sheet comprising a first conductive line disposed in the first area and extending in a first direction and a conductive layer disposed in the second area;
    a first circuit board bending from the first surface to the second surface to be connected to a first end of the first conductive line; and
    a second circuit board spaced apart from the first circuit board in the first direction, the second circuit board bending from the first surface to the second surface to be connected to a second end opposite to the first end of the first conductive line.

2. The display device of claim 1, wherein the first conductive line is spaced apart from the conductive layer, and electrically connect between the first circuit board and the second circuit board.

3. The display device of claim 1, wherein a thickness of the first conductive line is same as a thickness of the conductive layer.

4. The display device of claim 1, wherein the first conductive line and the conductive layer comprise a same material, and wherein:
    the first surface of the display panel is a front surface for displaying an image, and
    the second surface of the display panel is a rear surface.

5. The display device of claim 4, wherein the first conductive line and the conductive layer comprise copper.

6. The display device of claim 1, wherein the first conductive line comprises a signal line and a power line having a width greater than a width of the signal line.

7. The display device of claim 1, further comprising:
    an insulating layer disposed between the display panel and the conductive sheet.

8. The display device of claim 7, wherein the first conductive line comprises a plurality of connection lines spaced apart from each other in a second direction intersecting the first direction, and
    wherein the insulating layer in the first area is exposed through an opening between the plurality of connection lines.

9. The display device of claim 7, wherein the conductive layer in the second area covers the insulating layer.

10. The display device of claim 1, wherein the conductive sheet further comprises a second conductive line disposed in the second area, the second conductive line extending in a second direction intersecting the first direction and spaced apart from the conductive layer,
    wherein the display device further comprises a third circuit board spaced apart from the first circuit board in the second direction, the third circuit board connected to a first end of the second conductive line, and
    wherein the first circuit board connected to a second end opposite to the first end of the second conductive line.

11. A display device comprising:
    a display panel comprising a first surface and a second surface opposite to the first surface, the second surface having a first area, a second area adjacent to the first area in a first direction, a third area adjacent to the first and second areas in a second direction intersecting the first direction, and a fourth area surrounding the first to third areas;
    a conductive sheet disposed on the second surface of the display panel, the conductive sheet comprising a first conductive line extending from the first area to the third area and having a first end disposed in the first area and a second end opposite to the first end of the first conductive line disposed in the third area, a second conductive line extending from the second area to the third area and having a first end disposed in the second area and a second end opposite to the first end of the second conductive line disposed in the third area, and conductive layer disposed in the fourth area;
    a first circuit board bending from the first surface to the second surface to be connected to the first end of the first conductive line; and
    is a second circuit board spaced apart from the first circuit board in the first direction, the second circuit board bending from the first surface to the second surface to be connected to the first end of the second conductive line; and
    an external device connected to the second end of the first conductive line and the second end of the second conductive line.

12. The display device of claim 11, wherein:
    the first end of the first conductive line extends in the first direction, and
    the second end of the first conductive line extends in the second direction, and wherein:
    the first end of the second conductive line extends in the first direction, and
    the second end of the second conductive line extends in the second direction.

13. The display device of claim 11, wherein the second end of the first conductive line is adjacent to the second end of the second conductive line.

14. The display device of claim 11, wherein the conductive layer is spaced apart from the first and second conductive lines.

15. A display device comprising:
a display panel;
a conductive sheet disposed under the display panel, the conductive sheet comprising an induction coil wire and a conductive layer spaced apart from the induction coil wire; and
a circuit board connected to the induction coil wire.

16. The display device of claim 15, wherein the induction coil wire is wound along edges of the display panel.

17. The display device of claim 15, wherein a thickness of the induction coil wire is same as a thickness of the conductive layer.

18. The display device of claim 15, wherein the induction coil wire and the conductive layer comprise a same material.

19. The display device of claim 18, wherein the induction coil wire and the conductive layer comprise copper.

20. The display device of claim 15, wherein the induction coil wire is configured to generate an induced current based on a change in an external magnetic field.

* * * * *